United States Patent
Hong et al.

(10) Patent No.: US 8,400,802 B2
(45) Date of Patent: Mar. 19, 2013

(54) BINARY CONTENT ADDRESSABLE MEMORY

(75) Inventors: Sang Hoon Hong, Seongnam-si (KR); Chang Hoon Han, Wonju-si (KR); Min Ah Chae, Suwon-si (KR)

(73) Assignee: University-Industry Cooperation Group of Kyunghee University, Yongin-Si, Gyeonggi-Do (KR)

( * ) Notice: Subject to any disclaimer, the term of this patent is extended or adjusted under 35 U.S.C. 154(b) by 140 days.

(21) Appl. No.: 12/938,455

(22) Filed: Nov. 3, 2010

(65) Prior Publication Data
US 2011/0103120 A1  May 5, 2011

(30) Foreign Application Priority Data

Nov. 4, 2009 (KR) ............ 10-2009-0106179
Nov. 1, 2010 (KR) ............ 10-2010-0107432

(51) Int. Cl.
*G11C 15/00* (2006.01)
(52) U.S. Cl. ............ 365/49.17; 365/154; 365/209
(58) Field of Classification Search ............ 365/49, 365/154, 203
See application file for complete search history.

(56) References Cited

U.S. PATENT DOCUMENTS

| | | | |
|---|---|---|---|
| 5,319,589 A | 6/1994 | Yamagata et al. | |
| 6,188,629 B1 | 2/2001 | Kaplinsky | |
| 6,373,739 B1 * | 4/2002 | Lien et al. | 365/49.1 |
| 6,421,265 B1 | 7/2002 | Lien et al. | |
| 6,751,111 B2 | 6/2004 | Foss et al. | |
| 6,819,579 B1 * | 11/2004 | Liu et al. | 365/49.12 |
| 6,847,534 B2 | 1/2005 | Loughmiller | |
| 6,888,732 B2 | 5/2005 | Hu | |
| 7,016,211 B2 * | 3/2006 | Park et al. | 365/49.12 |

* cited by examiner

*Primary Examiner* — Son Dinh
(74) *Attorney, Agent, or Firm* — Lowe Hauptman Ham & Berner LLP

(57) ABSTRACT

The present invention relates to a binary content addressable memory (CAM), and more particularly, to a binary content addressable memory (CAM) in which the number of transistors constituting the content addressable memory can be reduced to decrease the size of the content addressable memory, thereby increasing the degree of integration and improving power consumption. According to the present invention, since the binary content addressable memory according to the present invention has a smaller number of transistors than those of the conventional binary content addressable memory, a memory can be fabricated in a smaller size, thereby improving the degree of integration as one of most important factors in the memory design. In addition, improvement of the degree of integration contributes to miniaturization and lightweightness of the product in its design. Further, the inventive binary content addressable memory performs its own function using a smaller number of transistors, thereby reducing power consumption.

2 Claims, 4 Drawing Sheets

FIG 1

| 1 | 1 | 0 | 1 | 0 | 0 | 1 |

(a)

| 1 | 0 | 1 | 0 | 0 | 0 | 1 |
| 1 | 0 | 1 | 1 | 0 | 1 | 0 |
| 1 | 1 | 0 | 1 | 0 | 0 | 1 |
| 1 | 0 | 1 | 1 | 1 | 0 | 0 |
| 1 | 0 | 1 | 1 | 0 | 0 | 1 |
| 1 | 1 | 0 | 0 | 1 | 1 | 1 | match (row 3)

(b)

(a)

(b)

BINARY CONTENT ADDRESSABLE MEMORY

CROSS-REFERENCE TO RELATED APPLICATIONS

This application claims the benefit of Korean Patent Application No.10-2009-0106179, filed on Nov. 4, 2009 and Korean Patent Application No.10-2010-0107432, filed on Nov. 1, 2010 in the Korean Intellectual Property Office, which are incorporated herein by reference in its entirety.

BACKGROUND OF THE INVENTION (a) Field of the Invention

The present invention relates to a binary content addressable memory (CAM), and more particularly, to a binary content addressable memory (CAM) in which the number of transistors constituting the content addressable memory can be reduced to decrease the size of the content addressable memory, thereby increasing the degree of integration and improving power consumption.

(b) Background Art

For a typical memory, an address in which a data is stored must be correctly confirmed in order to allow access to the stored data. However, a content addressable memory (CAM) is a memory having a function in which although a correct address in which a data is stored is not confirmed, when the content of the data is entered, an address of a location where the data of an associated content is stored can be found out. Thus, in the case where a specific content is searched from a number of data, owing to a unique fast search characteristic in which a data associated with a data matching a given content can be found out, IP address lookup methods using the content addressable memory (CAM) are widely used and are also utilized variously in a data search engine.

Such a content addressable memory can be largely divided into a binary content addressable memory (BCAM) and a ternary content addressable memory (TCAM). The binary content addressable memory (BCMA) is configured such that a data "0" or "1" is stored in a memory cell, and an input data and a stored data are compared with each other to search for an address of a location where the data of an associated content is stored. On the contrary, the ternary content addressable memory (TCAM) is configured such that a data "don't care" can be stored besides the data "0" or "1", and such that even in the case where the stored data is searched, a combination of "0", "1" and "don't care" is inputted and an input data and a stored value are compared with each other to search for an address of a location where the data of an associated content is stored.

FIG. 1 is a schematic diagram showing one example of searching for data stored in a binary content addressable memory (BCAM), wherein FIG. 1(a) shows data which it is desired to search, and FIG. 1(b) shows data stored in the binary content addressable memory (BCAM). As shown in FIG. 1(a), the data which it is desired to search includes 1, 1, 0, 1, 0, 0 and 1. The binary content addressable memory compares an input data and a stored data, and searches, as a matching data, the data which matches the input data among the data stored in the binary content addressable memory (BCAM), i.e., the data stored in a third row of the stored data as shown in FIG. 2(b). In this manner, since the binary content addressable memory searches the data of a content which matches an input data in its entirety from the data stored therein., although an address in which an associated input data is stored is not confirmed, a matching data of the associated input data can be searched from the stored data only by using the content of the associated input data FIG. 2 is a schematic circuit diagram showing a conventional binary content addressable memory (BCAM).

Referring to FIG. 2, the conventional binary content addressable memory includes: a storage unit 10 for storing data of "0" and "1"; a bit line portion for inputting a data to be stored in the storage unit 10 or inputting a comparison data used to determine the stored data, the bit line portion being composed of a first bit line BL and a second bit line BL/; a word line WL for controlling the activation of the storage unit 10; and a comparator circuit unit 20 for comparing the comparison data inputted through the bit line portion BL and BL/ with a storage data stored in the storage unit 10, and determining whether or not the storage data stored in the content addressable memory and the inputted comparison data match each other.

The storage unit 10 includes a first NMOS transistor $M_1$ and a second NMOS transistor $M_2$ whose sources are connected to the bit line portion BL and BL/, and a pair of inverters $I_1$ and $I_2$ connected with each other in a feedback loop fashion for storing the data inputted through the bit line portion BL and BL/. Each of a first inverter $I_1$ and a second inverter $I_2$ is composed of a PMOS transistor and a NMOS transistor.

In the meantime, the comparator circuit unit 20 includes a matching line ML precharged to a high (H) level in response to a precharge signal, a third NMOS transistor $M_3$ and a fourth NMOS transistor $M_4$ whose gates are connected to the pair of inverters $I_1$ and $I_2$ so as to be activated/deactivated by the data stored in the pair of inverters $I_1$ and $I_2$, and a fifth NMOS transistor $M_5$ whose drain is connected to the matching line ML.

A drain of the third NMOS transistor $M_3$ and a source of the fourth NMOS transistor $M_4$ are connected to each other, and a gate of the fifth NMOS transistor $M_5$ is connected to a node A to which the third NMOS transistor $M_3$ and the fourth NMOS transistor $M_4$ are connected. In this case, a source of the fifth NMOS transistor $M_5$ is grounded. When the data stored in the storage unit 10 is determined, the word line WL is deactivated. If it is determined that there is a mach between the comparison data inputted through the bit line portion BL and BL/ and the storage data stored in the storage unit 10, the matching line ML is maintained in a precharged state to output a high level value as a result of the comparison. On the other hand, if it is determined that there is a mismatch between the comparison data inputted through the bit line portion BL and BL/ and the storage data stored in the storage unit 10, the matching line ML is discharged to output a low level value as a result of the comparison.

As discussed above, in the conventional binary content addressable memory, data must be separately inputted to the first input line BL and the second input line BL/ in order to store the data in the storage unit 10. Furthermore, the storage unit 10 includes a plurality of transistors, i.e., a total of six (6) transistors, of which two (2) NMOS transistors $M_1$ and $M_2$ are connected to the input line portion BL and BL/, and four (4) transistors (not shown) constitute the pair of inverters $I_1$ and $I_2$. Thus, the conventional binary content addressable memory includes a total of nine (9) transistors, of which six (6) transistors are used in the storage unit 10 and three (3) transistors are used in the comparator circuit unit 20.

The most important factor which must be considered in the memory design is that the size of a memory is reduced to increase the degree of integration, and that power consumption is reduced through the high-performance design. The conventional binary content addressable memory, however, basically employs a total of nine (9) transistors, including the comparator circuit unit 20, and requires that data should be separately inputted to the first input line BL and the second input line BL/ in order to store the data in the storage unit 10.

Therefore, such a conventional binary content addressable memory has a limitation in integration and entails a problem in that a number of transistors and the first and second input lines are employed to increase power consumption and high performance is not exhibited due to complexity of the process.

The information disclosed in this background of the invention section is only for enhancement of understanding of the background of the invention and should not be taken as an acknowledgement or any form of suggestion that this information forms the prior art that is already known to a person skilled in the art.

SUMMARY OF THE INVENTION

Accordingly, the present invention has been made in an effort to solve the aforementioned problems occurring in the prior art, and it is an object of the present invention to provide a binary content addressable memory in which the number of elements used in the content addressable memory can be reduced to decrease the area occupied by the content addressable memory.

Another object of the present invention is to provide a binary content addressable memory in which the size of the binary content addressable memory is reduced to increase the degree of integration.

Yet another object of the present invention is to provide a binary content addressable memory in which the number of the transistors constituting the content addressable memory can be reduced to decrease power consumption.

Still another object of the present invention is to provide a binary content addressable memory in which the number of transistors is reduced, and data is stored based on a single data input so that a small number of processes enable storage or comparison of the data, thereby exhibiting high performance.

To accomplish the above object, the present invention provides a binary content addressable memory (BCAM) including: a first transistor whose gate is connected to a word line WL to allow the activation of the first transistor to be controlled; a second transistor and a third transistor for storing a storage data inputted through a first bit line BL when the first transistor is activated; a comparator circuit unit for comparing the storage data stored in the second transistor and the third transistor with a comparison data inputted through the first bit line BL and a second bit line BL/, and outputting a result value of the comparison.

In the binary content addressable memory of the present invention, the comparator circuit unit includes: a matching line precharged in response to a comparison signal; and a fourth transistor of which activation is controlled in response to the comparison data inputted through the first and second bit line BL and BL/ and the storage data after the matching line is precharged, so as to output the result value of the comparison for application to the matching line.

Preferably, in the binary content addressable memory of the present invention, the first transistor, the third transistor, and the fourth transistor are NMOS transistors, and the second transistor is a PMOS transistor.

Also, preferably, a source of the first transistor is connected to the first bit line, a drain of the first transistor is connected to gates of the second transistor and the third transistor, and a gate of the first transistor is connected to the word line, respectively.

In addition, preferably, a source and a drain of the second PMOS transistor are connected to the first bit line and a drain of the third NMOS transistor. A source of the third NMOS transistor is connected to the second bit line, and a drain of the fourth NMOS transistor is connected to the matching line. A gate of the fourth NMOS transistor is connected to a connection node between the drain of the second PMOS transistor and the drain of the third NMOS transistor, and a source of the fourth NMOS transistor is grounded.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 1 is a schematic diagram showing one example of searching for data stored in a binary content addressable memory (BCAM);

DETAILED DESCRIPTION

Figure 2:
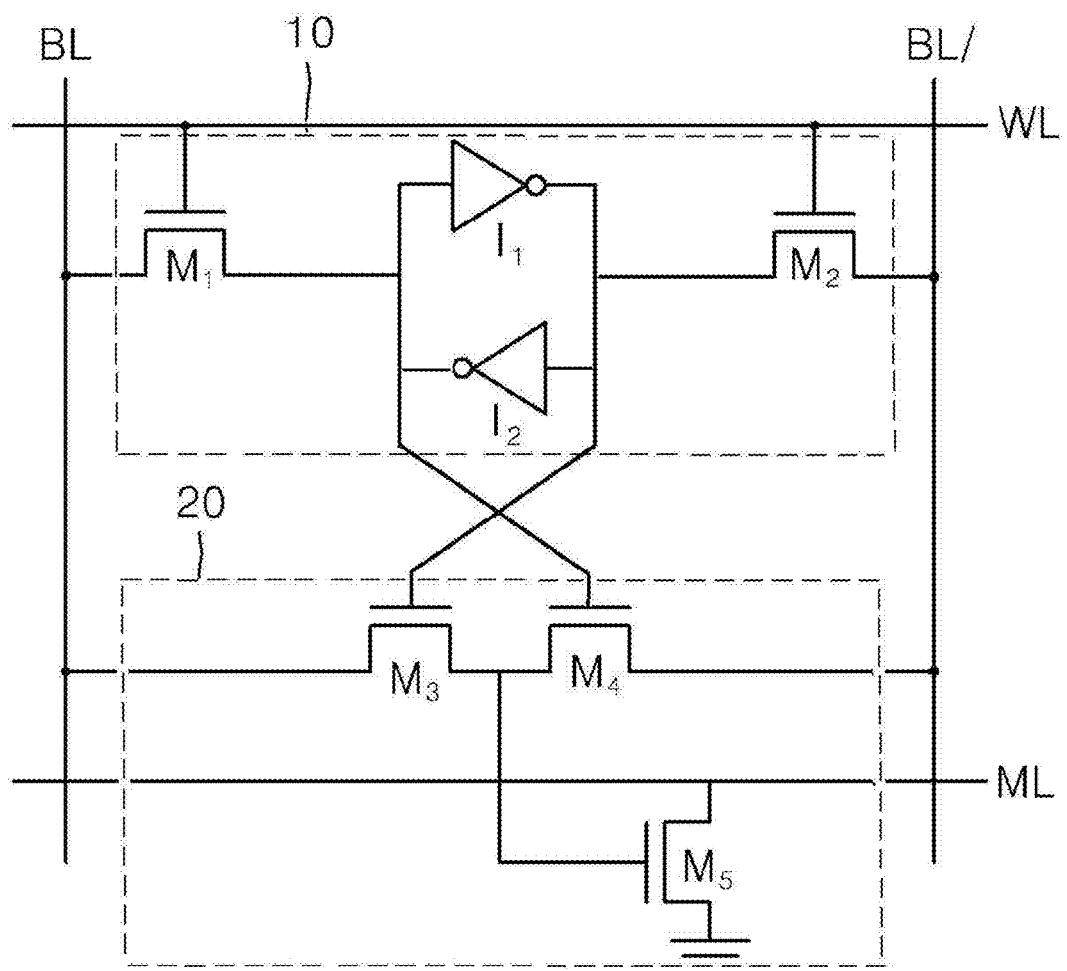
FIG. 2 is a schematic circuit diagram showing a conventional binary content addressable memory (BCAM)

A binary content addressable memory according to a preferred embodiment of the present invention will now be described in detail with reference to the accompanying drawings, examples of which are illustrated in the drawings attached hereinafter, wherein like reference numerals refer to like elements throughout. In the detailed description of the preferred embodiments of the present invention, the size, the shape or the like of constituent elements may be exaggeratedly shown in the drawings for the sake of clarity and convenience of explanation.

Figure 3:
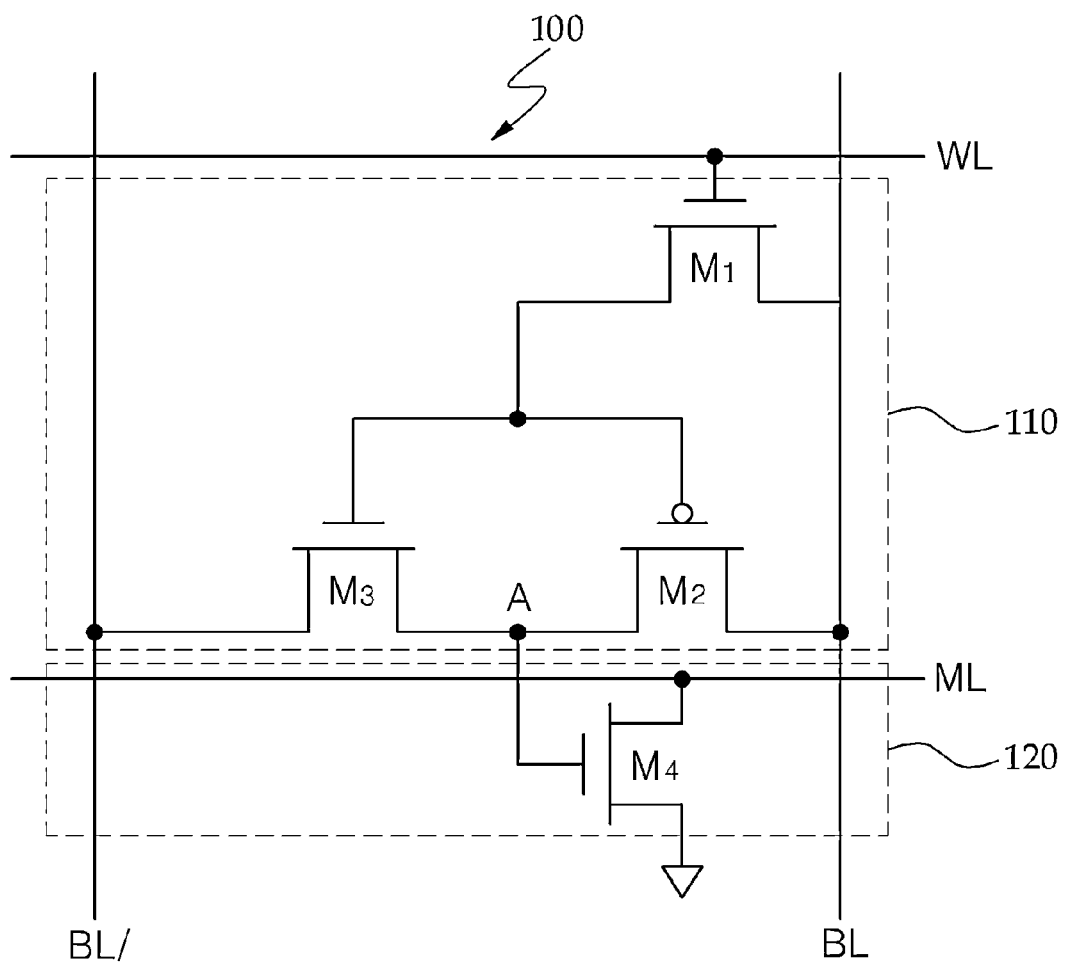
FIG. 3 is a schematic circuit diagram showing a binary content addressable memory (BCAM) 100 according to a preferred embodiment of the present invention.

FIG. 3 is a schematic circuit diagram showing a binary content addressable memory (BCAM) 100 according to a preferred embodiment of the present invention.

Referring to FIG. 3, the binary content addressable memory according to the present invention includes a storage unit 110 for storing data of "0" and "1"; a bit line portion composed of a first bit line BL for inputting a data to be stored in the storage unit 110 or a first comparison data and a second bit line BL/ for inputting a second comparison data; a word line WL for controlling the activation of the storage unit 110; and a comparator circuit unit 120 for comparing the comparison data inputted through the bit line portion BL and BL/ with a storage data stored in the storage unit 110, and determining whether or not the storage data stored in the content addressable memory and the inputted comparison data match each other.

The storage unit 110 includes a first transistor $M_1$, a second transistor $M_2$, and a third transistor $M_3$. A source, a drain, and a gate of the first transistor $M_1$ are connected to the first bit line BL, gates of the second transistor $M_2$ and the third transistor $M_3$, and the word line WL, respectively. Meanwhile, a source and a drain of the second transistor are connected to the first bit line BL and a drain of the third transistor $M_3$, respectively. A source of the third transistor $M_3$ is connected to the second bit line BL/.

In the meantime, the comparator circuit unit 120 includes a matching line ML and a fourth transistor $M_4$.

The drain of the second transistor $M_2$ and the drain of the third transistor $M_3$ are connected to each other, and a gate of the fourth transistor $M_4$ is connected to a connection node A between the drain of the second transistor $M_2$ and the drain of the third transistor $M_3$. A drain of the fourth transistor $M_4$ is connected to the matching line ML, and a source of the fourth transistor $M_4$ is grounded. The comparator circuit unit 120 compares the comparison data inputted through the bit line portion BL and BL/ with the storage data stored in the storage unit 110, and outputs a result value of the comparison for application to the matching line ML.

Preferably, the first transistor $M_1$, the third transistor $M_3$, and the fourth transistor $M_4$ are NMOS transistors, and the second transistor $M_2$ is a PMOS transistor.

Figure 4:
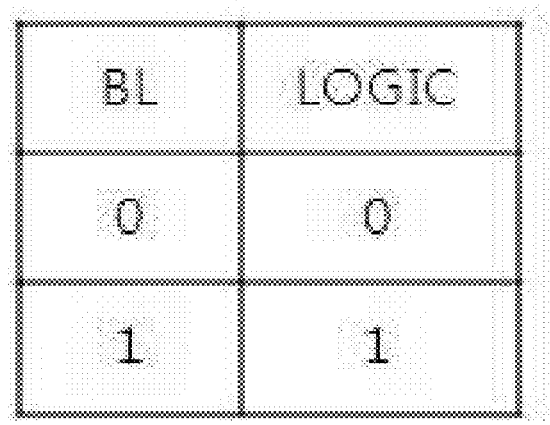
FIG. 4 shows data values inputted to a first bit line BL and a second bit line BL/ to compare and search a data inputted to the first bit line BL and data stored in a binary memory cell to store a data "0" or "1" in a binary content addressable memory (BCAM) 100 according to a preferred embodiment of the present invention.
Figure 4:
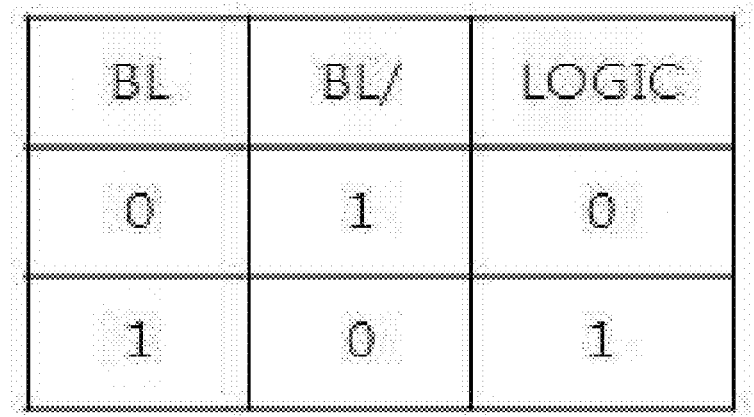

FIG. 4 shows data values inputted to a first bit line BL and a second bit line BL/ to compare and search a data inputted to the first bit line BL and data stored in a binary memory cell to store a data "0" or "1" in a binary content addressable memory (BCAM) 100 according to a preferred embodiment of the present invention.

As shown in FIG. 4(a), a data value "0" is inputted to the first bit line BL to store the data value "0" in the binary content addressable memory, and a data value "1" is inputted to the first bit line BL to store the data value "1" in the binary content addressable memory. In the meantime, as shown FIG. 4(b), the data value "0" is inputted to the first bit line BL and the data value "1" is inputted to the second bit line BL/ to determine whether or not the data stored in the binary content addressable memory is "0". On the other hand, the data value "1" is inputted to the first bit line BL and the data value "0" is inputted to the second bit line BL/ to determine whether or not the data stored in the binary content addressable memory is "1".

An operation of storing the data in the binary content addressable memory according to the present invention and an operation of searching for the stored data will be described hereinafter in more detail with reference to FIGS. 3 and 4.

<Storage Operation>

In the case where a data value "0" is stored in the binary content addressable memory 100, a high-level signal is inputted to the word line WL to activate the first transistor $M_1$ and the data value "0" is inputted to the first bit line BL to allow the data value "0" to be stored in the second transistor $M_2$ and the third transistor $M_3$. When the storage of the data value "0" is completed, the word line WL is allowed to maintain a low signal.

Similarly, In the case where a data value "1" is stored in the binary content addressable memory 100, a high-level signal is inputted to the word line WL to activate the first transistor $M_1$ and the data value "1" is inputted to the first bit line BL to allow the data value "1" to be stored in the second transistor $M_2$ and the third transistor $M_3$. When the storage of the data value "1" is completed, the word line WL is allowed to maintain a low signal.

<Search Operation>

In order to determine whether or not the data value stored in the binary content addressable memory 100 is "0", comparison data values "0" and "1" are inputted to the first bit line BL and the second bit line BL/, respectively. In the case where "0" is stored in the binary content addressable memory 100, the second transistor $M_2$ as a PMOS transistor is activated and the third transistor $M_3$ as an NMOS transistor is deactivated. Thus, the comparison data "0" inputted to the first bit line BL is inputted to the gate of the fourth transistor $M_4$ along the node A. Then, since the comparison data "0" inputted to the gate of the fourth transistor $M_4$ is a signal having a low value, the fourth transistor $M_4$ is deactivated and the matching line ML is maintained in a precharged state to output a comparison value of a high signal. That is, the comparison value of a high signal indicates that the data value stored in the binary content addressable memory is "0".

On the other hand, in the case where "1" is stored in the binary content addressable memory 100, the second transistor $M_2$ as a PMOS transistor is deactivated and the third transistor $M_3$ as an NMOS transistor is activated. Thus, the comparison data "1" inputted to the second bit line BL/ is inputted to the gate of the fourth transistor $M_4$ along the node A. Then, since the comparison data "1" inputted to the gate of the fourth transistor $M_4$ is a signal having a high value, the fourth transistor $M_4$ is activated and the matching line ML is discharged to output a comparison value of a low signal. That is, the comparison value of a low signal indicates that the data value stored in the binary content addressable memory is not "0".

Similarly, In order to determine whether or not the data value stored in the binary content addressable memory 100 is "1", comparison data values "1" and "0" are inputted to the first bit line BL and the second bit line BL/, respectively. In the case where "1" is stored in the binary content addressable memory 100, the second transistor $M_2$ as a PMOS transistor is deactivated and the third transistor $M_3$ as an NMOS transistor is activated. Thus, the comparison data "0" inputted to the second bit line BL/ is inputted to the gate of the fourth transistor $M_4$ along the node A. Then, since the comparison data "0" inputted to the gate of the fourth transistor $M_4$ is a signal having a low value, the fourth transistor $M_4$ is deactivated and the matching line ML is maintained in a precharged state to output a comparison value of a high signal. That is, the comparison value of a high signal indicates that the data value stored in the binary content addressable memory is "1".

On the other hand, in the case where "0" is stored in the binary content addressable memory 100, the second transistor $M_2$ as a PMOS transistor is activated and the third transistor $M_3$ as an NMOS transistor is deactivated. Thus, the comparison data "1" inputted to the first bit line BL is inputted to the gate of the fourth transistor $M_4$ along the node A. Then, since the comparison data "1" inputted to the gate of the fourth transistor $M_4$ is a signal having a high value, the fourth transistor $M_4$ is activated and the matching line ML is discharged to output a comparison value of a low signal. That is, the comparison value of a low signal indicates that the data value stored in the binary content addressable memory is not "1".

While the present invention has been described in connection with the exemplary embodiments illustrated in the drawings, they are merely illustrative embodiments, and the invention is not limited to these embodiments. It is to be understood that various equivalent modifications and variations of the embodiments can be made by a person having an ordinary skill in the art without departing from the spirit and scope of the present invention. Therefore, various embodiments of the present invention are merely for reference in defining the scope of the invention, and the true technical scope of the present invention should be defined by the technical spirit of the appended claims.

What is claimed is:

1. A binary content addressable memory (BCAM) comprising:
- a first transistor whose gate is connected to a word line WL to allow the activation of the first transistor to be controlled;
- a second transistor and a third transistor for storing a storage data inputted through a first bit line BL when the first transistor is activated; and
- a comparator circuit unit for comparing the storage data stored in the second transistor and the third transistor with a comparison data inputted through the first bit line BL and a second bit line BL/, and outputting a result value of the comparison, wherein the comparator circuit unit comprises:
  - a matching line precharged in response to a comparison signal; and
  - a fourth transistor of which activation is controlled in response to the comparison data inputted through the first and second bit line BL and BL/ and the storage data after the matching line is precharged, so as to output the result value of the comparison for application to the matching line, wherein the first transistor, the third transistor, and the fourth transistor are NMOS transistors, and the second transistor is a PMOS transistor, and wherein a source and a drain of the second PMOS transistor are connected to the first bit line and a drain of the third NMOS transistor, wherein a source of the third NMOS transistor is connected to the second bit line, and wherein a drain of the fourth NMOS transistor is connected to the matching line, a gate of the fourth NMOS transistor is connected to a connection node between the drain of the second PMOS transistor and the drain of the third NMOS transistor, and a source of the fourth NMOS transistor is grounded.

2. The binary content addressable memory (BCAM) according to claim 1, wherein a source of the first transistor is connected to the first bit line, a drain of the first transistor is connected to gates of the second transistor and the third transistor, and a gate of the first transistor is connected to the word line, respectively.

* * * * *